US010453967B2

(12) United States Patent
Mehandru et al.

(10) Patent No.: US 10,453,967 B2
(45) Date of Patent: Oct. 22, 2019

(54) SEMICONDUCTOR NANOWIRE DEVICE HAVING CAVITY SPACER AND METHOD OF FABRICATING CAVITY SPACER FOR SEMICONDUCTOR NANOWIRE DEVICE

(71) Applicant: Intel Corporation, Santa Clara, CA (US)

(72) Inventors: Rishabh Mehandru, Portland, OR (US); Szuya S. Liao, Hillsboro, OR (US); Stephen M. Cea, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/743,575

(22) PCT Filed: Sep. 10, 2015

(86) PCT No.: PCT/US2015/049499
§ 371 (c)(1),
(2) Date: Jan. 10, 2018

(87) PCT Pub. No.: WO2017/044107
PCT Pub. Date: Mar. 16, 2017

(65) Prior Publication Data
US 2018/0204955 A1    Jul. 19, 2018

(51) Int. Cl.
*H01L 29/786* (2006.01)
*H01L 29/06* (2006.01)
(Continued)

(52) U.S. Cl.
CPC ........ *H01L 29/78696* (2013.01); *B82Y 10/00* (2013.01); *H01L 21/823821* (2013.01);
(Continued)

(58) Field of Classification Search
CPC .................................................. H01L 29/0673
See application file for complete search history.

(56) References Cited

U.S. PATENT DOCUMENTS 9,660,028 B1 * 5/2017 Cheng ................. H01L 29/0673
2011/0012085 A1    1/2011 Deligianni et al.
(Continued)

OTHER PUBLICATIONS

International Preliminary Report on Patentability for PCT/US2015/049499, dated Mar. 22, 2018, 6 pages.
(Continued)

*Primary Examiner* — Matthew L Reames
*Assistant Examiner* — John A Bodnar
(74) *Attorney, Agent, or Firm* — Schwabe, Williamson & Wyatt, P.C.

(57) ABSTRACT

Semiconductor nanowire devices having cavity spacers and methods of fabricating cavity spacers for semiconductor nanowire devices are described. For example, a semiconductor device includes a plurality of vertically stacked nanowires disposed above a substrate, each of the nanowires including a discrete channel region. A common gate electrode stack surrounds each of the discrete channel regions of the plurality of vertically stacked nanowires. A pair of dielectric spacers is on either side of the common gate electrode stack, each of the pair of dielectric spacers including a continuous material disposed along a sidewall of the common gate electrode and surrounding a discrete portion of each of the vertically stacked nanowires. A pair of source and drain regions is on either side of the pair of dielectric spacers.

18 Claims, 9 Drawing Sheets

(51) Int. Cl.
*H01L 29/423* (2006.01)
*H01L 29/66* (2006.01)
*H01L 27/092* (2006.01)
*H01L 21/8238* (2006.01)
*B82Y 10/00* (2011.01)
*H01L 29/775* (2006.01)

(52) U.S. Cl.
CPC ...... *H01L 27/0924* (2013.01); *H01L 29/0653* (2013.01); *H01L 29/0673* (2013.01); *H01L 29/42392* (2013.01); *H01L 29/66439* (2013.01); *H01L 29/66545* (2013.01); *H01L 29/775* (2013.01); *H01L 29/66469* (2013.01)

(56) References Cited

U.S. PATENT DOCUMENTS

| | | |
|---|---|---|
| 2013/0175502 A1 | 7/2013 | Bangsaruntip et al. |
| 2014/0001441 A1 | 1/2014 | Kim et al. |
| 2014/0084249 A1 | 3/2014 | Basker et al. |
| 2014/0151639 A1* | 6/2014 | Chang ............... H01L 29/42392 257/27 |
| 2014/0209855 A1* | 7/2014 | Cea .................. H01L 29/41791 257/9 |

OTHER PUBLICATIONS

International Search Report and Written Opinion for International Patent Application No. PCT/US2015/049499 dated Feb. 26, 2016, 9 pgs.

* cited by examiner

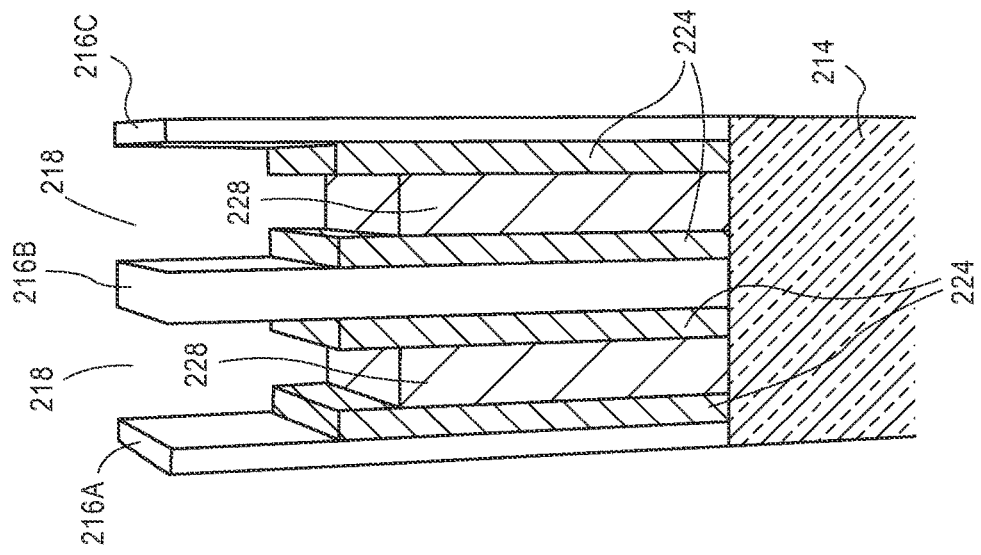
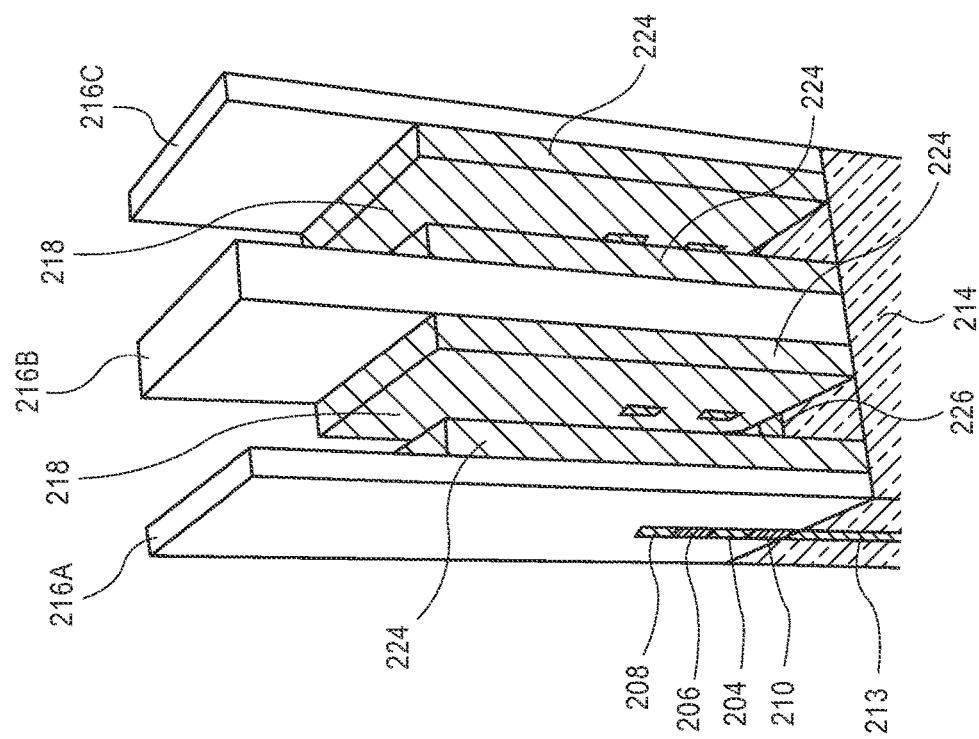
FIG. 2F
FIG. 2E

SEMICONDUCTOR NANOWIRE DEVICE HAVING CAVITY SPACER AND METHOD OF FABRICATING CAVITY SPACER FOR SEMICONDUCTOR NANOWIRE DEVICE

CROSS-REFERENCE TO RELATED APPLICATION

This patent application is a U.S. National Phase Application under 35 U.S.C. § 371 of International Application No. PCT/US2015/049499, filed Sep. 10, 2015, entitled "SEMICONDUCTOR NANOWIRE DEVICE HAVING CAVITY SPACER AND METHOD OF FABRICATING CAVITY SPACER FOR SEMICONDUCTOR NANOWIRE DEVICE," which designates the United States of America, the entire disclosure of which is hereby incorporated by reference in its entirety and for all purposes.

TECHNICAL FIELD

Embodiments of the invention are in the field of semiconductor devices and, in particular, semiconductor nanowire devices having cavity spacers and methods of fabricating cavity spacers for semiconductor nanowire devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, or gate-all-around devices, such as nanowires, have become more prevalent as device dimensions continue to scale down. Many different techniques have been attempted to reduce parasitic capacitance of such transistors. However, significant improvements are still needed in the area of parasitic capacitance suppression. Also, many different techniques have been attempted to manufacture devices with non-Si channel materials such as SiGe, Ge, and III-V materials. However, significant process improvements are still needed to integrate these materials onto Si wafers.

BRIEF DESCRIPTION OF THE DRAWINGS

FIG. 1C' illustrates a cross-sectional spacer view of a conventional nanowire-based semiconductor structure.

FIGS. 2A-2J illustrate three-dimensional cross-sectional views representing various operations in a method of fabricating a semiconductor nanowire structure having a cavity spacer, in accordance with an embodiment of the present invention, where:

FIG. 2A illustrates a starting structure including a fin formed above a semiconductor substrate;

FIG. 2B illustrates the structure of FIG. 2A following sacrificial gate stack material deposition and gate patterning;

FIG. 2C illustrates the structure of FIG. 2B following removal of the portions of the first and second sacrificial release layers exposed in the source and drain regions of the protruding portion of the fin;

FIG. 2D illustrates the structure of FIG. 2C following deposition of a spacer-forming material layer.

FIG. 2E illustrates the structure of FIG. 2D following etching of the spacer-forming material layer to form cavity spacers;

FIG. 2F illustrates the structure of FIG. 2E following growth of source and drain structures between the cavity spacers;

FIG. 2G illustrates the structure of FIG. 2F following formation of a planarization oxide and removal of the three sacrificial gates;

FIG. 2H illustrates the structure of FIG. 2G following removal of the portions of the first and second sacrificial release layers exposed in the channel regions of the protruding portion of the fin;

FIG. 2I illustrates the structure of FIG. 2H following formation of a gate dielectric layer on the portions of the active wire-forming layers and in the channel regions; and FIG. 2J illustrates the structure of FIG. 2I following formation of permanent gate electrodes.

DESCRIPTION OF THE EMBODIMENTS

Semiconductor nanowire devices having cavity spacers and methods of fabricating cavity spacers for semiconductor nanowire devices are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be appreciated that the various embodiments shown in the Figures are illustrative representations and are not necessarily drawn to scale.

One or more embodiments described herein are directed to nanowire-based field effect transistor (FET) MOS transistors. Particular embodiments are directed to cavity spacers for such nanowire devices.

To provide context, reducing parasitic capacitance in nanowires and also reducing dopant contamination in active wires can greatly improve the performance of such devices. In accordance with an embodiment of the present invention, parasitic capacitance is reduced by forming a cavity spacer by removing a sacrificial layer subsequent to gate patterning.

The process can involve isotropically depositing a spacer material followed by a spacer etch process performed in source and drain regions of the device. In addition to reducing parasitic capacitance, embodiments described herein may also be useful for limiting entry of source and drain dopant material into active channel regions that may otherwise occur through a sacrificial semiconductor layer.

More specifically, one or more embodiments described herein are directed to approaches for forming silicon (Si)-containing non-planar architectures. For example, in an embodiment one or more devices described herein may be characterized as a Si-based device, a nanoribbon-based device, a nanowire-based device, a non-planar transistor, or a multi-gate device. More specifically, one or more embodiments are directed to performing a total or partial release of Si-containing features from SiGe/Si multilayer stacks.

Advantages of embodiments described include low parasitic capacitance and improved short channel effects for nanowire-based semiconductor devices. Such improvements can enable scaling for next generation devices by rendering nanowires viable through parasitic capacitance reduction and improved short channel effects. Additional advantages may include the ability to limit source and drain dopant entry into channel regions of the nanowire device.

Figure 1A:
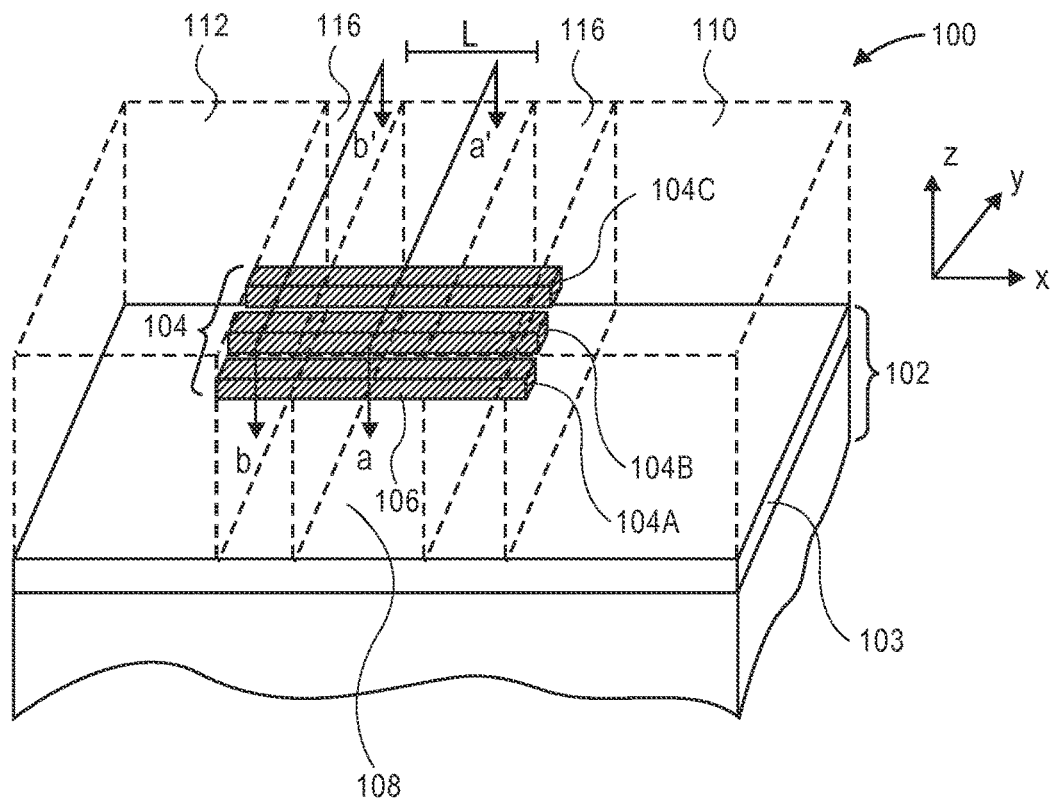
FIG. 1A illustrates a three-dimensional cross-sectional view of a nanowire-based semiconductor structure having a cavity spacer, in accordance with an embodiment of the present invention.
Figure 1B:
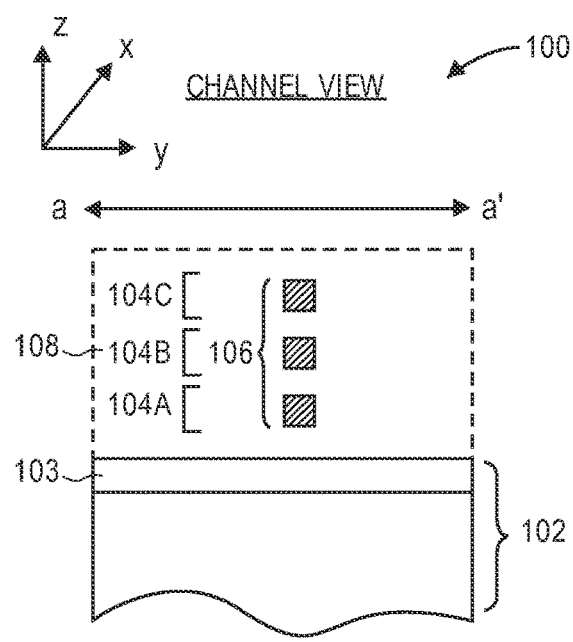
FIG. 1B illustrates a cross-sectional channel view of the nanowire-based semiconductor structure of FIG. 1A, as taken along the a-a' axis, in accordance with an embodiment of the present invention.
Figure 1C:
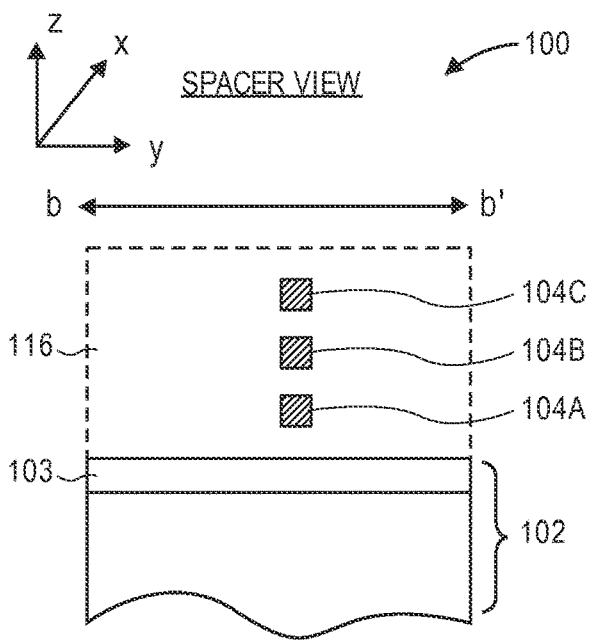
FIG. 1C illustrates a cross-sectional spacer view of the nanowire-based semiconductor structure of FIG. 1A, as taken along the b-b' axis, in accordance with an embodiment of the present invention.
Figure 1C:
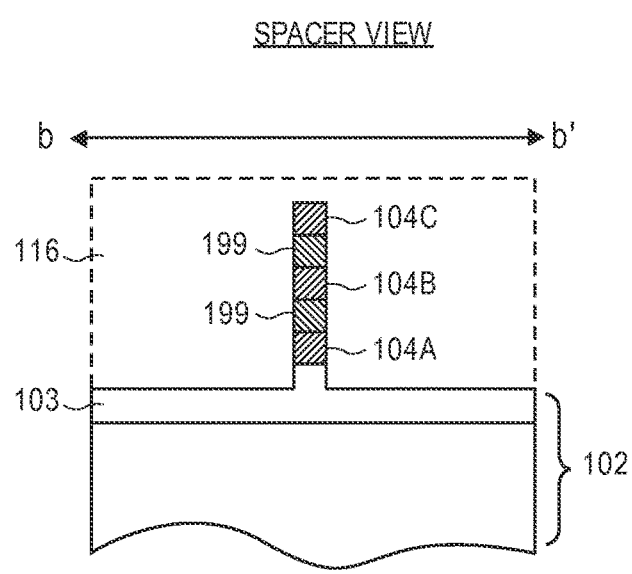

As an example of some of the structural ramifications of implementing a cavity spacer, FIG. 1A illustrates a three-dimensional cross-sectional view of a nanowire-based semiconductor structure having a cavity spacer, in accordance with an embodiment of the present invention. FIG. 1B illustrates a cross-sectional channel view of the nanowire-based semiconductor structure of FIG. 1A, as taken along the a-a' axis, in accordance with an embodiment of the present invention. FIG. 1C illustrates a cross-sectional spacer view of the nanowire-based semiconductor structure of FIG. 1A, as taken along the b-b' axis, in accordance with an embodiment of the present invention.

Referring to FIG. 1A, a semiconductor device 100 includes one or more vertically stacked nanowires (104 set) disposed above a substrate 102. Embodiments herein are targeted at both single wire devices and multiple wire devices. As an example, a three nanowire-based devices having nanowires 104A, 104B and 104C is shown for illustrative purposes. For convenience of description, nanowire 104A is used as an example where description is focused on only one of the nanowires. It is to be appreciated that where attributes of one nanowire are described, embodiments based on a plurality of nanowires may have the same attributes for each of the nanowires. Features described below are shown somewhat simplistically in FIG. 1A, for ease of illustration. For example, cavity spacers 116 and gate electrode stack 108 are shown as essentially co-planar in FIG. 1A; however, as described in greater detail in association with FIGS. 2A-2J, the cavity spacers 116 may be recessed below the gate electrode stack 108. Additionally, source and drain regions 110 and 112 and cavity spacers 116 are shown as essentially co-planar in FIG. 1A; however, as described in greater detail in association with FIGS. 2A-2J, the source and drain regions 110 and 112 may be recessed below the cavity spacers 116. Alternatively, in another embodiment, the source and drain regions 110 and 112 are raised above the cavity spacers 116.

Referring to both FIGS. 1A and 1B, each of the nanowires 104 (e.g., as 104A, 104B and 104C) includes a channel region 106 disposed in the nanowire. The channel region 106 has a length (L). A gate electrode stack 108 surrounds the entire perimeter of each of the channel regions 106. The gate electrode stack 108 includes a gate electrode along with a gate dielectric layer disposed between the channel region 106 and the gate electrode (distinct gate electrode and gate dielectric layer not shown here, but described in greater detail below in association with FIGS. 2A-2J). The channel region 106 is discrete in that it is completely surrounded by the gate electrode stack 108 without any intervening material such as underlying substrate material or overlying channel fabrication materials. Accordingly, in embodiments having a plurality of nanowires 104 e.g., such as nanowires 104A, 104B and 104C), the channel regions 106 of the nanowires are also discrete relative to one another. However, it is to be appreciated, in some embodiments, the lowermost wire or wires may not be fully discrete and may have a tri-gate like architecture at the bottom portion of the wire stack.

Referring to FIG. 1A, each of the nanowires 104 is coupled to common source and drain regions 110 and 112 disposed on either side of the channel regions 106. In an embodiment, the common source and drain regions 110 and 112 are semiconductor regions. Although not depicted, a pair of conductive contacts may be formed on the common source/drain regions 110/112.

Referring to FIGS. 1A and 1C, in an embodiment, the semiconductor device 100 further includes a pair of spacers 116. The spacers 116 are disposed between the gate electrode stack 108 and the common source and drain regions 110 and 112. For reasons that will become apparent in the description of FIGS. 2A-2J below, the spacers 116 may be referred to as cavity spacers. In an embodiment, each of the pair of spacers 116 is a continuous spacer, as oppose to having distinct outer and inner spacers. In one such embodiment, each spacer of the pair of spacers 116 includes a continuous material disposed along a sidewall of the gate electrode stack 108 and surrounding a discrete portion of each of the vertically stacked nanowires 104.

As mentioned briefly above, embodiments described herein may also be useful for limiting entry of source and drain dopant material into active channel regions that may otherwise occur through a sacrificial semiconductor layer. FIG. 1C' illustrates a cross-sectional spacer view of a conventional nanowire-based semiconductor structure. Referring to FIG. 1C', in contrast to FIG. 1C, spacer 116 does not surround discrete portions of the nanowires 104. Instead, an intervening sacrificial material portion 199 remains after conventions nanowire processing (e.g., in the case that removal of sacrificial material portion 199 is hindered either by etch limitations or by the nature of the processing integrations scheme used). Such an intervening sacrificial material portion 199 can provide an undesirable entry path for dopants into the channel regions 106 of the nanowires 104.

Substrate 102 may be composed of a material suitable for semiconductor device fabrication. In one embodiment, substrate 102 includes a lower bulk substrate composed of a single crystal of a material which may include, but is not limited to, silicon, germanium, silicon-germanium or a Group III-V compound semiconductor material. In an embodiment, an upper insulator layer 103 composed of a material which may include, but is not limited to, silicon dioxide, silicon nitride or silicon oxy-nitride is disposed on the lower bulk substrate. Thus, the structure 100 may be fabricated from a starting semiconductor-on-insulator substrate. Alternatively, the structure 100 is formed directly from a bulk substrate and local oxidation is used to form electrically insulative portions in place of the above described upper insulator layer. In another alternative embodiment, the structure 100 is formed directly from a bulk substrate and doping may be used to form electrically isolated active regions, such as nanowires, thereon.

In an embodiment, the nanowires 104 may be sized as wires or ribbons and may have squared-off or rounder corners. In an embodiment, the nanowires 104 are composed of a material such as, but not limited to, silicon, germanium, silicon germanium, or a Group III-V material. In one such embodiment, the nanowires are single-crystalline. For example, for a silicon nanowire 104, a single-crystalline nanowire may be based from a (100) global orientation, e.g., with a <100> plane in the z-direction. It is to be appreciated that other orientations may also be considered. In an embodiment, the dimensions of the nanowires 104, from an end-on cross-sectional perspective, are on the nano-scale. For example, in a specific embodiment, the smallest dimension of each of the nanowires 104 is less than approximately 20 nanometers.

In an embodiment, the nanowires 104 are composed of a strained material, particularly in the channel regions 106. In an embodiment, the nanowires 104A-104C are uniaxially strained nanowires. The uniaxially strained nanowire or plurality of nanowires may be uniaxially strained with tensile strain or with compressive strain, e.g., for NMOS or PMOS, respectively. The width and height of each of the nanowires 104A-104C is shown as approximately the same, however, they need not be. For example, in another embodiment (not shown), the width of the nanowires 104A-104C is substantially greater than the height. In a specific embodiment, the width is approximately 2-10 times greater than the height. Nanowires with such geometry may be referred to as nanoribbons. In an alternative embodiment (also not shown), the nanoribbons are oriented vertically. That is, each of the nanowires 104A-104C has a width and a height, the width substantially less than the height.

In an embodiment, the gate electrode of gate electrode stack 108 is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the nanowire 104. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

In an embodiment, the source and drain regions 110/112 are embedded source and drain regions, e.g., at least a portion of the nanowires is removed and replaced with a source/drain material region, as is depicted in FIG. 1A. In an embodiment, the common source and drain regions 110 and 112 are semiconductor regions. In one such embodiment, the semiconductor regions are epitaxially grown from the ends of the nanowires 104 and/or from an exposed portion of an underlying bulk semiconductor substrate (the latter example described in greater detail below in association with FIGS. 2A-2J). In an embodiment, the common source and drain regions 110 and 112 are composed of a material such as, but not limited to, silicon, germanium, silicon germanium, or a Group III-V material. In one embodiment, the common source and drain regions 110 and 112 are doped with impurity atoms. In an embodiment, the common source and drain regions 110 and 112 are composed of a material different from the channel material. For example, in an embodiment, for PMOS a silicon channel is used together with silicon germanium source and drain regions. In an embodiment, for NMOS, a silicon channel is used together with InAs source and drain regions. Alternatively, the common source and drain regions 110 and 112 are composed of a material the same as or similar to the channel material.

In an embodiment, the cavity spacers 116 are composed of an insulative dielectric material such as, but not limited to, silicon dioxide, silicon oxy-nitride or silicon nitride. Overlying source/drain contacts (not shown) are, in an embodiment, fabricated from a metal species. The metal species may be a pure metal, such as nickel or cobalt, or may be an alloy such as a metal-metal alloy or a metal-semiconductor alloy (e.g., such as a silicide material).

In an embodiment, the semiconductor device 100 is a MOS-FET. In one embodiment, the semiconductor device is a three-dimensional MOS-FET and is an isolated device or is one device in a plurality of nested devices. As will be appreciated for a typical integrated circuit, both N- and P-channel transistors may be fabricated on a single substrate to form a CMOS integrated circuit. Furthermore, additional interconnect wiring may be fabricated in order to integrate such devices into an integrated circuit.

In another aspect, a sacrificial or replacement gate process may be used to first access source and drain regions and then access channel regions to form nanowire devices with low parasitic capacitance. As an example, FIGS. 2A-2J illustrate three-dimensional cross-sectional views representing various operations in a method of fabricating a semiconductor nanowire structure having a cavity spacer, in accordance with an embodiment of the present invention.

Figure 2B:
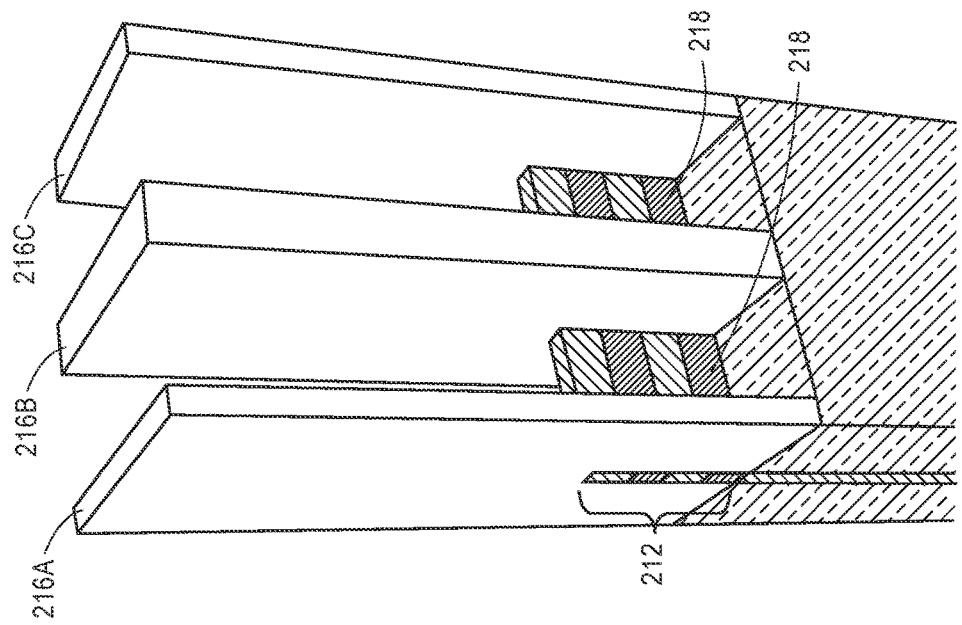
Figure 2A:
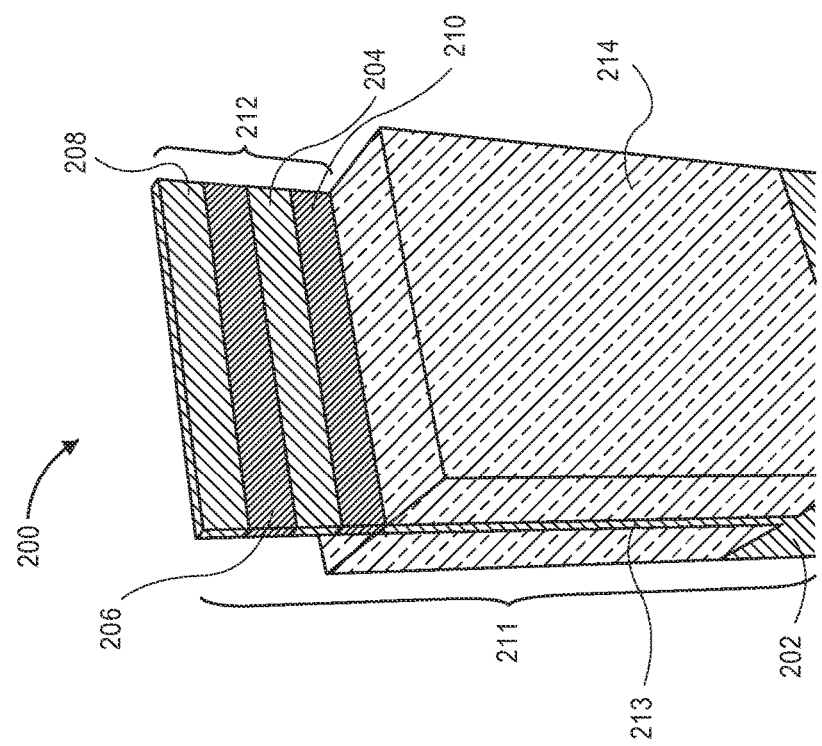

Referring to FIG. 2A, a starting structure 200 includes a fin 211 formed above a semiconductor substrate 202. The fin 211 includes a buried portion 213 and a protruding portion 212. The protruding portion 212 includes active wire-forming layers 204 and 208, such as silicon wire-forming layers. A first sacrificial release layer 206 (such as a first silicon germanium sacrificial release layer) is disposed between the active wire-forming layers 204 and 208. A second sacrificial release layer 210 (such as a second silicon germanium sacrificial release layer) is disposed between the active wire-forming layer 204 and the buried portion 213 of the fin 211. In an embodiment, an isolation material region 214 (such as a silicon oxide region) is formed on either side of the buried portion 213 of the fin 211, but the protruding portion 212 remains electrically coupled to the substrate 202, as is depicted in FIG. 2A. In other embodiments, however, it is to be appreciated that, in the case of fabrication of bulk devices, a subsequently formed permanent gate stack may be isolated from the semiconductor substrate 202 by a shallow trench isolation (STI) region formed after fin patterning. Alternatively, a subsequently formed permanent gate stack may be isolated from the semiconductor substrate 202 by a bottom gate isolation (BGI) structure, which may be fabricated at the time of permanent gate stack fabrication.

Referring again to FIG. 2A, in an embodiment, then, nanowires can ultimately be formed by first stacking active and sacrificial materials and then etching the desired fin stack, followed by isolation material deposition, planarization and etch. In the specific example described, the formation of two silicon nanowires is considered. It is to be appreciated that, in another embodiment, two silicon germanium nanowires may ultimately be formed.

FIG. 2B illustrates the structure of FIG. 2A following sacrificial gate stack material deposition and gate patterning. In a specific example showing the formation of three gate structures, FIG. 2B illustrates the protruding portion 212 of the fin 211 with three sacrificial gates 216A, 216B, and 216C disposed thereon. In one such embodiment, the three sacrificial gates 216A, 216B, and 216C are composed of a sacrificial gate oxide layer and a sacrificial polysilicon gate layer which are, e.g., blanket deposited and patterned with a plasma etch process. It is to be appreciated that the patterning of the three sacrificial gates 216A, 216B, and 216C exposes source and drain regions 218 of the protruding portion 212 of the fin 211.

Figure 2D:
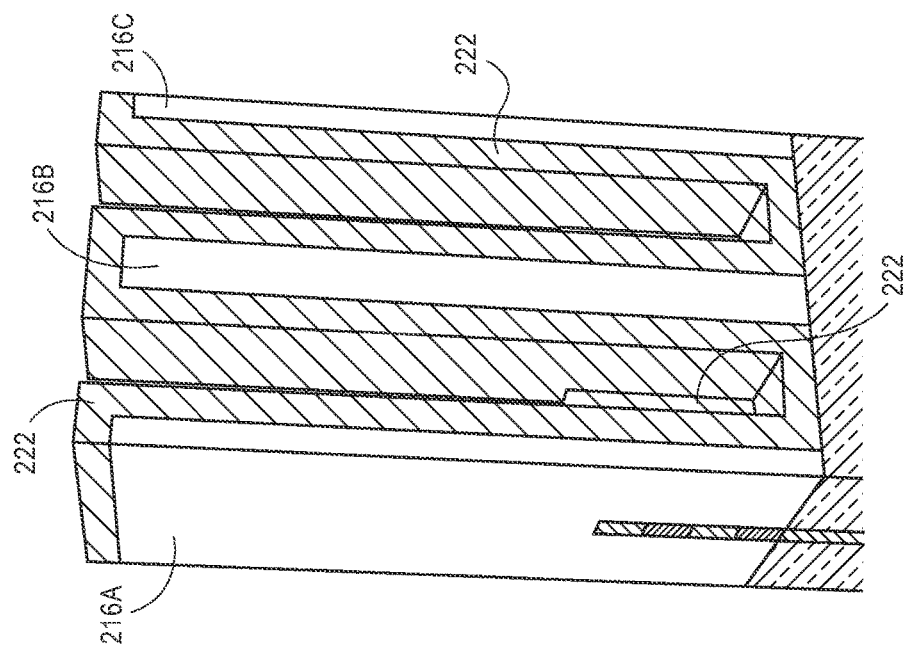
Figure 2C:
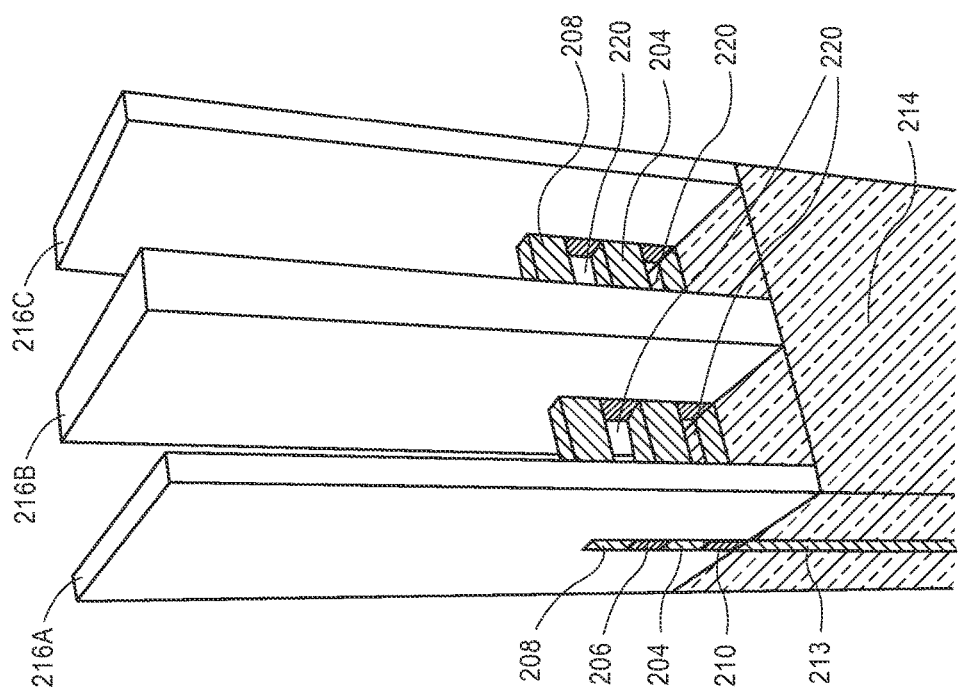

FIG. 2C illustrates the structure of FIG. 2B following removal of the portions of the first 206 and second 210 sacrificial release layers exposed in the source and drain regions 218 of the protruding portion 212 of the fin 211. The removal forms spacings 220 between the active wire-forming layers 204 and 208 and between the active wire-forming layer 204 and the buried portion 213 of the fin 211. However, in an embodiment, the portions of the first 206 and second 210 sacrificial release layers underneath the three sacrificial gates 216A, 216B, and 216C is retained, as is depicted in FIG. 2C.

In an embodiment, etch chemistries such as carboxylic acid/nitric acid/HF chemistry, and citric acid/nitric acid/HF, for example, may be utilized to selectively etch the portions of first and second silicon germanium sacrificial release layers (selective to silicon active wires) exposed in the source and drain regions 218 of the protruding portion 212 of the fin 211. Alternatively, an isotropic dry etch may be used. In another embodiment, etch chemistries such as aqueous hydroxide chemistries, including ammonium hydroxide and potassium hydroxide, for example, may be utilized to selectively etch the portions of first and second silicon sacrificial release layers (selective to silicon germanium or germanium active wires) exposed in the source and drain regions 218 of the protruding portion 212 of the fin 211. Alternatively, an isotropic dry etch may be used. Thus, either a silicon germanium layer may be removed from a silicon active regions or a silicon layer may be removed from a silicon germanium active region.

FIG. 2D illustrates the structure of FIG. 2C following deposition of a spacer-forming material layer 222. In an embodiment, the spacer-forming material layer 222 is an insulative dielectric material such as, but not limited to, silicon dioxide, silicon oxy-nitride or silicon nitride. In an embodiment, the spacer-forming material layer 222 is formed by atomic layer deposition (ALD).

FIG. 2E illustrates the structure of FIG. 2D following etching of the spacer-forming material layer 222 to form cavity spacers 224. The cavity spacers are formed along the sidewalls of the three sacrificial gates 216A, 216B, and 216C. In an embodiment, an anisotropic plasma etching process is used to form the cavity spacers 224. In an embodiment, the etching process also removes the portions of the active wire-forming layers 204 and 208 exposed in the source and drain regions 218, as is depicted in FIG. 2E. However, the portions of the active wire-forming layers 204 and 208 beneath the cavity spacers 224 are retained. In a further embodiment, the etching process recesses a portion of the buried portion 213 of the fin 211 to form a recessed portion 226, as is also depicted in FIG. 2E. In an embodiment, the cavity spacers 224 are formed to a height below the height of the three sacrificial gates 216A, 216B, and 216C, as is depicted in FIG. 2E.

FIG. 2F illustrates the structure of FIG. 2E following growth of source and drain structures 228 between the cavity spacers 224. In an embodiment, the growth of source and drain structures 228 is performed by epitaxial deposition of a semiconductor material in the source and drain regions 218. In one embodiment, the epitaxial growth is initiated on exposed ends of the portions of the active wire-forming layers 204 and 208 beneath the cavity spacers 224. In another embodiment, the epitaxial growth is initiated on the exposed surface of the recessed portion 226 of the buried portion 213 of the fin 211. In yet another embodiment, the epitaxial growth is initiated on exposed ends of the portions of the active wire-forming layers 204 and 208 beneath the cavity spacers 224 and on the exposed surface of the recessed portion 226 of the buried portion 213 of the fin 211. In an embodiment, the source and drain structures 228 are formed to a height below the height of the cavity spacers 224, as is depicted in FIG. 2F. In an embodiment, doping of the source and drain structures 228 may be performed either in situ or post epitaxial growth.

Figure 2H:
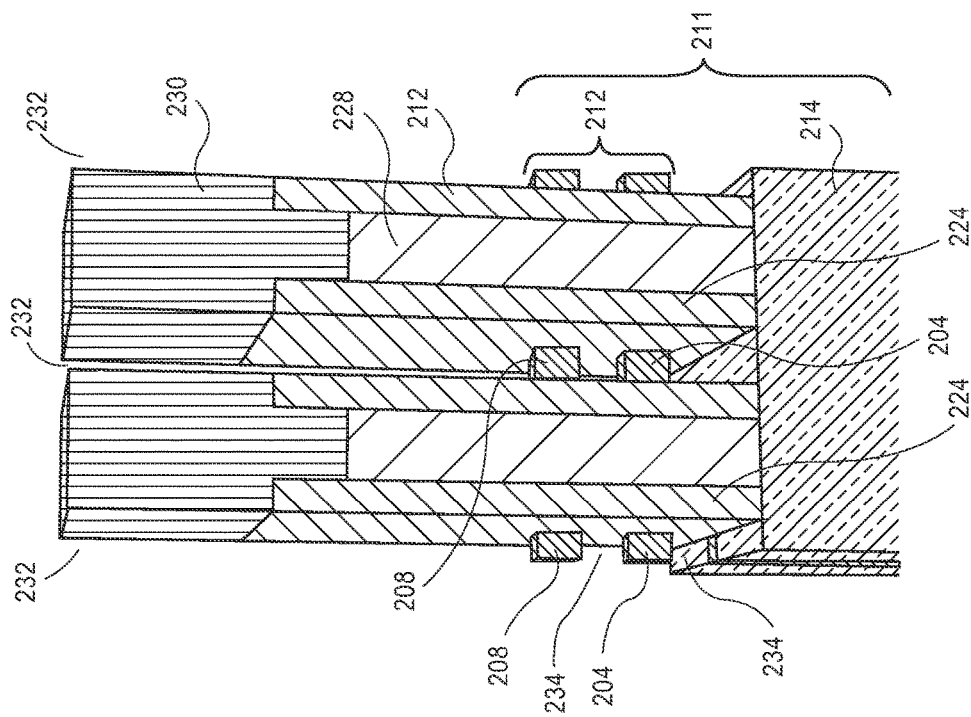
Figure 2G:
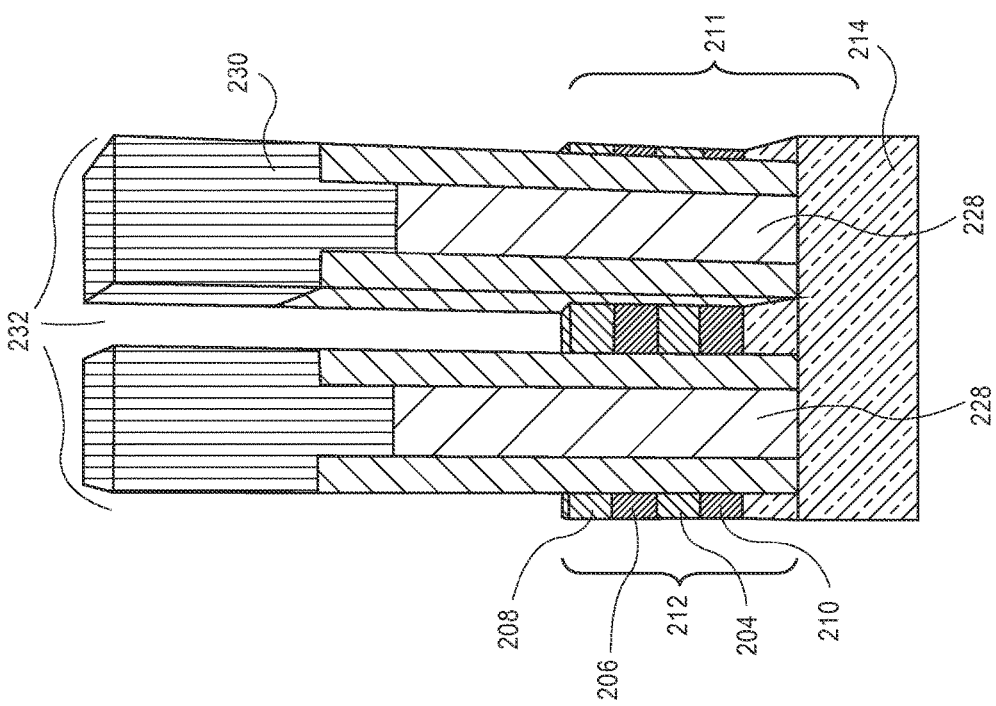

FIG. 2G illustrates the structure of FIG. 2F following formation of a planarization oxide 230 and removal of the three sacrificial gates 216A, 216B, and 216C. For example, in an embodiment, an oxide is deposited and planarized prior to removal of the three sacrificial gates 216A, 216B, and 216C. Such a planarization oxide 230 covers the source and drain structures 228. Removal of the sacrificial gates 216A, 216B, and 216C is then performed without damage to adjacent structures, exposing channel regions 232.

FIG. 2H illustrates the structure of FIG. 2G following removal of the portions of the first 206 and second 210 sacrificial release layers exposed in the channel regions 232 of the protruding portion 212 of the fin 211. The removal forms spacings 234 between the active wire-forming layers 204 and 208 and between the active wire-forming layer 204 and the buried portion 213 of the fin 211.

In an embodiment, etch chemistries such as carboxylic acid/nitric acid/HF chemistry, and citric acid/nitric acid/HF, for example, may be utilized to selectively etch the portions of first and second silicon germanium sacrificial release layers (selective to silicon active wires) exposed in the channel regions 232 of the protruding portion 212 of the fin 211. Alternatively, an isotropic dry etch may be used. In another embodiment, etch chemistries such as aqueous hydroxide chemistries, including ammonium hydroxide and potassium hydroxide, for example, may be utilized to selectively etch the portions of first and second silicon sacrificial release layers (selective to silicon germanium or germanium active wires) exposed in the channel regions 232 of the protruding portion 212 of the fin 211. Alternatively, an isotropic dry etch may be used. Thus, either a silicon germanium layer may be removed from a silicon active regions or a silicon layer may be removed from a silicon germanium active region.

The discrete portions of the active wire-forming layers 204 and 208 formed in the channel regions 232 will, in one embodiment, ultimately become channel regions in a nanowire-based device. Thus, at the process stage depicted in FIG. 2H, channel engineering or tuning may be performed. For example, in one embodiment, the discrete portions of the active wire-forming layers 204 and 208 shown in FIG. 2H are subsequently thinned using oxidation and etch processes.

Figure 2J:
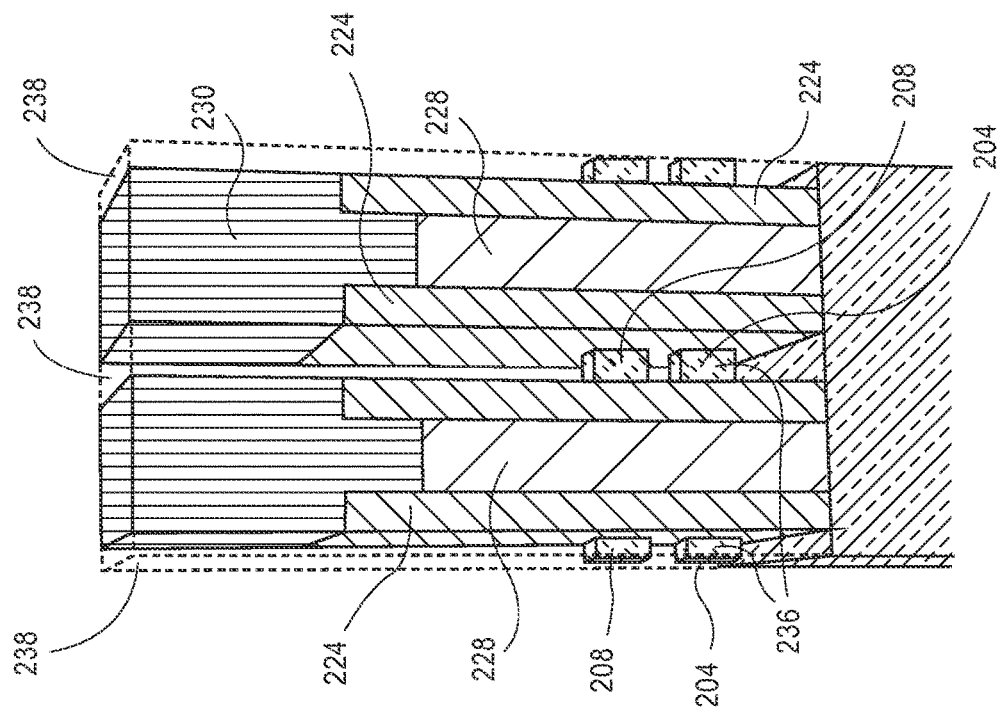
Figure 2I:
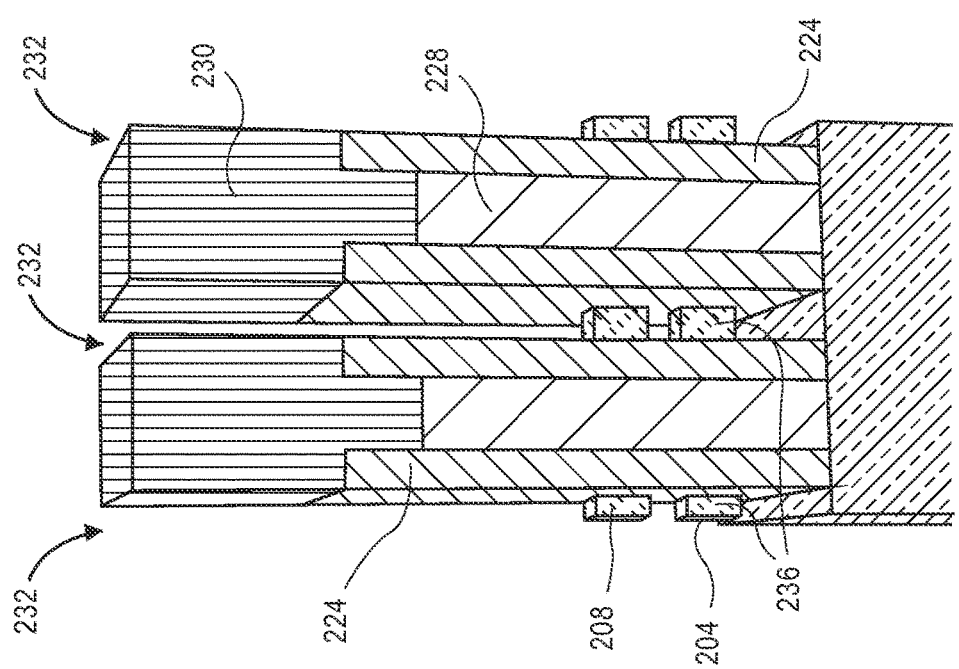

FIG. 2I illustrates the structure of FIG. 2H following formation of a gate dielectric layer 236 on the portions of the active wire-forming layers 204 and 208 in the channel regions 232. In an embodiment, the gate dielectric layer 236 is a high-k gate dielectric layer. In an embodiment, the gate dielectric layer 236 is formed by atomic layer deposition (ALD). In an embodiment, the gate dielectric layer 236 is formed selectively on the portions of the active wire-forming layers 204 and 208 in the channel regions 232. In another embodiment, however, the gate dielectric layer 236 is formed conformally on the structure of FIG. 2H.

FIG. 2J illustrates the structure of FIG. 2I following formation of permanent gate electrodes 238. Each of the permanent gate electrodes 238 completely surrounds the portions of the active wire-forming layers 204 and 208 in the channel regions 232. The permanent gate electrodes 238 may be formed by depositing a metal (or metal-containing material) or stack of metals (or stack metal-containing materials) in the channel regions 232. It is to be appreciated that further fabrication may involve formation of conductive contacts to source and drain structures 228 and/or to gate electrodes 238. In an embodiment, the completed device of FIG. 2J exhibits reduced parasitic capacitance due to presence of the cavity spacers 224.

It is to be appreciated that different material stacks may be preferable for a PMOS or an NMOS device fabricated on a common substrate or as part of a common circuit. In such an embodiment, a semiconductor structure includes an NMOS semiconductor device. The NMOS semiconductor device includes a plurality of vertically stacked silicon nanowires disposed above a substrate, each of the silicon nanowires including a discrete channel region, a common NMOS gate electrode stack surrounding each of the discrete channel regions of the plurality of vertically stacked silicon nanowires, a first pair of dielectric spacers on either side of the common NMOS gate electrode stack, each of the first pair of dielectric spacers including a continuous material disposed along a sidewall of the common NMOS gate electrode and surrounding a discrete portion of each of the vertically stacked silicon nanowires, and a pair of NMOS source and drain regions on either side of the first pair of dielectric spacers. The semiconductor structure also includes a PMOS semiconductor device. The PMOS semiconductor device includes a plurality of vertically stacked silicon germanium or germanium nanowires disposed above a substrate, each of the silicon germanium or germanium nanowires including a discrete channel region, a common PMOS gate electrode stack surrounding each of the discrete channel regions of the plurality of vertically stacked silicon germanium or germanium nanowires, a second pair of dielectric spacers on either side of the common PMOS gate electrode stack, each of the second pair of dielectric spacers including a continuous material disposed along a sidewall of the common PMOS gate electrode and surrounding a discrete portion of each of the vertically stacked silicon germanium or germanium nanowires, and a pair of PMOS source and drain regions on either side of the second pair of dielectric spacers.

However, other PMOS/NMOS arrangements may be considered. For example, in addition to or in place of the materials listed above, NMOS channel regions may be composed of germanium or a III-V material such as InAs, InGaAs (various compositions ranging from 0.5 to 1.0 In), GaAs, GaN. In addition to or in place of the materials listed above, PMOS channel materials could be based on silicon.

Figure 3:
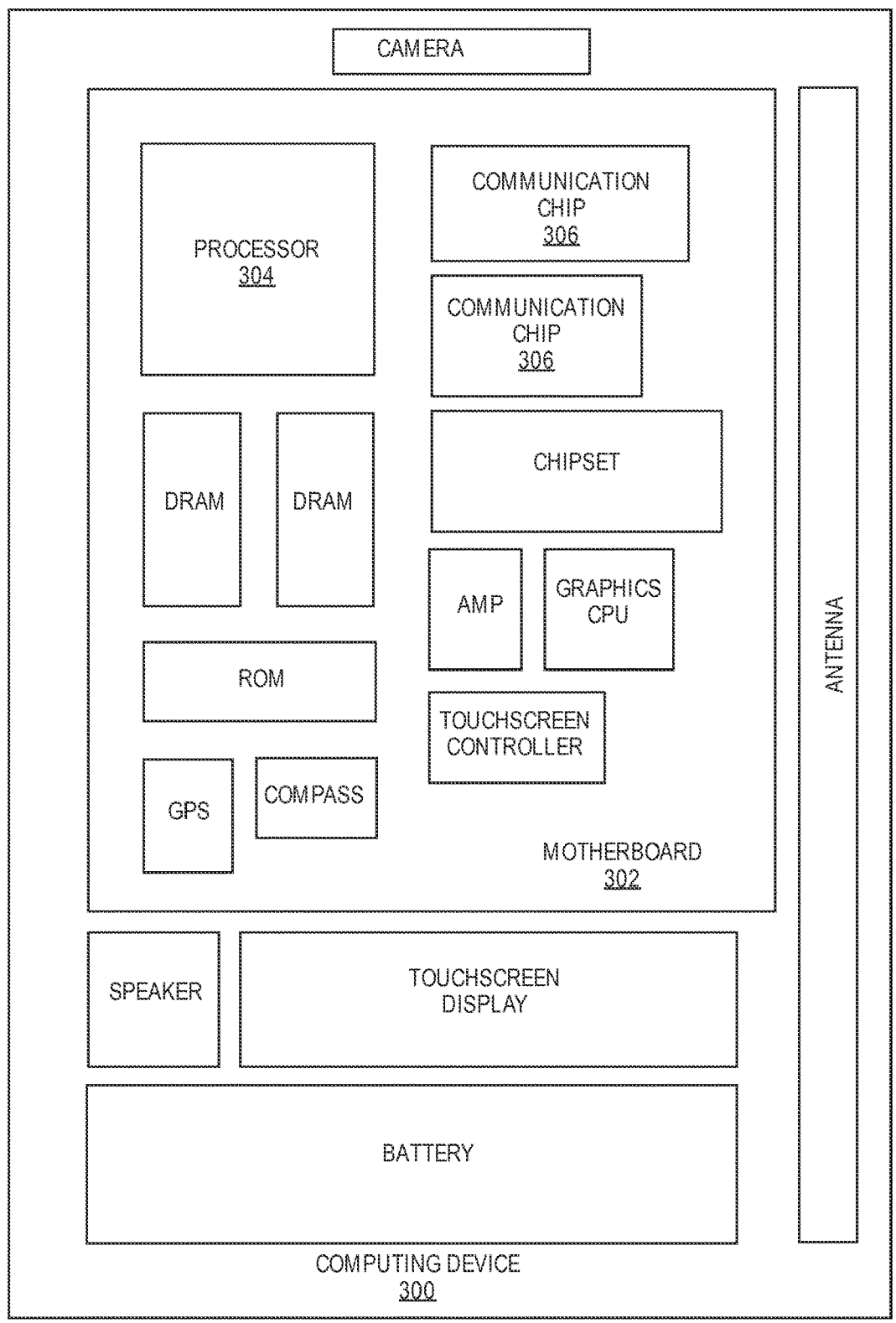
FIG. 3 illustrates a computing device in accordance with one implementation of the invention.

FIG. 3 illustrates a computing device 300 in accordance with one implementation of the invention. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the invention, the integrated circuit die of the communication chip includes one or more devices, such as MOS-FET transistors built in accordance with implementations of the invention.

In further implementations, another component housed within the computing device 300 may contain an integrated circuit die that includes one or more devices, such as MOS-FET transistors built in accordance with implementations of the invention.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

Figure 4:
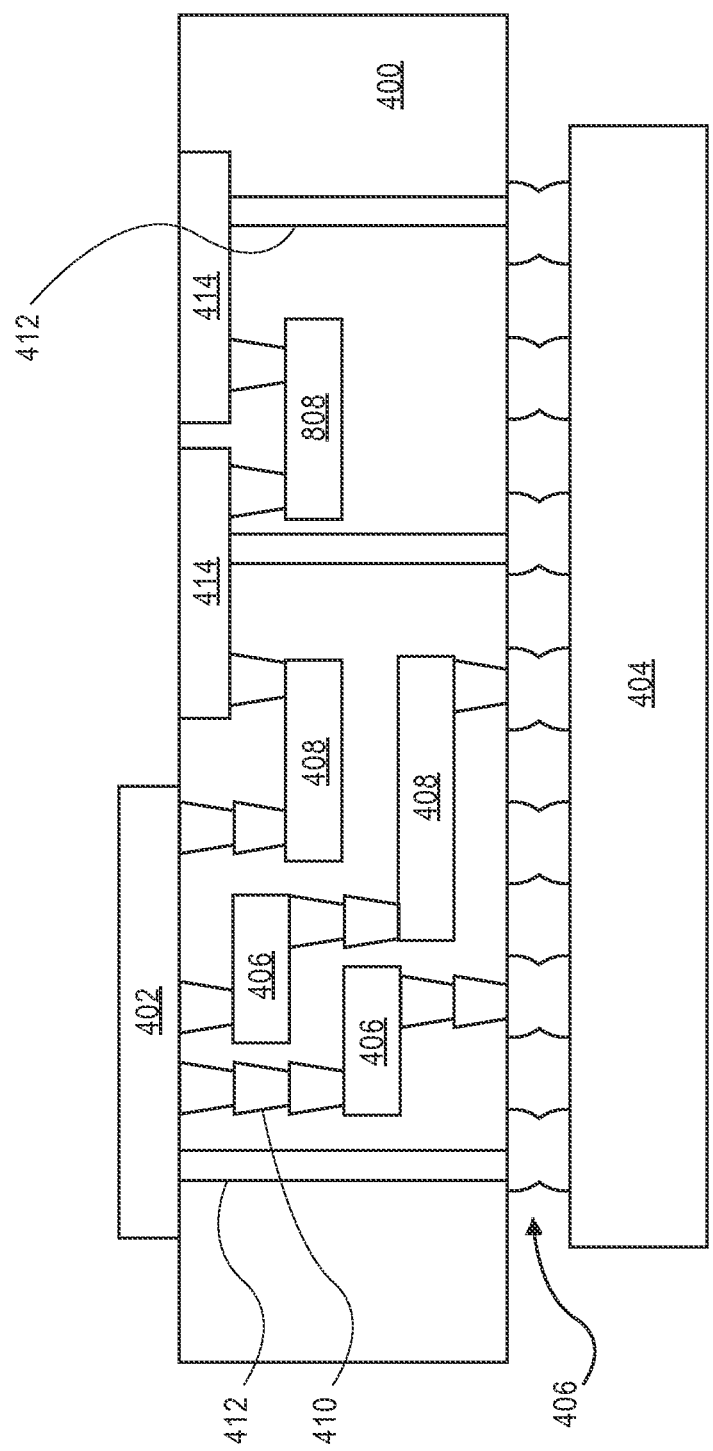
FIG. 4 is an interposer implementing one or more embodiments of the invention.

FIG. 4 illustrates an interposer 400 that includes one or more embodiments of the invention. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400. In accordance with embodiments of the invention, apparatuses or processes disclosed herein may be used in the fabrication of interposer 400.

Thus, embodiments of the present invention include semiconductor nanowire devices having cavity spacers and methods of fabricating cavity spacers for semiconductor nanowire devices.

In an embodiment, a semiconductor device includes a plurality of vertically stacked nanowires disposed above a substrate, each of the nanowires including a discrete channel region. A common gate electrode stack surrounds each of the discrete channel regions of the plurality of vertically stacked nanowires. A pair of dielectric spacers is on either side of the common gate electrode stack, each of the pair of dielectric spacers including a continuous material disposed along a sidewall of the common gate electrode and surrounding a discrete portion of each of the vertically stacked nanowires. A pair of source and drain regions is on either side of the pair of dielectric spacers.

In one embodiment, an uppermost surface of the pair of dielectric spacers is below an uppermost surface of the common gate electrode stack.

In one embodiment, the pair of source and drain regions has an uppermost surface below the uppermost surface of the pair of dielectric spacers.

In one embodiment, the pair of source and drain regions is a pair of common source and drain regions coupled to the plurality of vertically stacked nanowires.

In one embodiment, the substrate is a single crystalline semiconductor substrate, and the pair of common source and drain regions is a pair of epitaxial semiconductor regions further coupled to an exposed portion of the single crystalline semiconductor substrate.

In one embodiment, the semiconductor device further includes a pair of conductive contacts disposed on the pair of common source and drain regions.

In one embodiment, the common gate electrode stack includes a high-k gate dielectric layer disposed on and surrounding each of the discrete channel regions of the plurality of vertically stacked nanowires.

In one embodiment, the common gate electrode stack further includes a metal gate disposed on the high-k gate dielectric layer.

In one embodiment, the substrate is a monocrystalline silicon substrate, and the plurality of vertically stacked nanowires is a plurality of vertically stacked single crystalline silicon nanowires.

In one embodiment, the substrate is a monocrystalline silicon substrate, and the plurality of vertically stacked nanowires is a plurality of vertically stacked single crystalline silicon germanium or single crystalline germanium nanowires.

In an embodiment, a semiconductor structure includes an NMOS semiconductor device. The NMOS semiconductor device includes a plurality of vertically stacked silicon nanowires disposed above a substrate, each of the silicon nanowires including a discrete channel region, a common NMOS gate electrode stack surrounding each of the discrete channel regions of the plurality of vertically stacked silicon nanowires, a first pair of dielectric spacers on either side of the common NMOS gate electrode stack, each of the first pair of dielectric spacers including a continuous material disposed along a sidewall of the common NMOS gate electrode and surrounding a discrete portion of each of the vertically stacked silicon nanowires, and a pair of NMOS source and drain regions on either side of the first pair of dielectric spacers. The semiconductor structure also includes a PMOS semiconductor device. The PMOS semiconductor device includes a plurality of vertically stacked silicon germanium or germanium nanowires disposed above a substrate, each of the silicon germanium or germanium nanowires including a discrete channel region, a common PMOS gate electrode stack surrounding each of the discrete channel regions of the plurality of vertically stacked silicon germanium or germanium nanowires, a second pair of dielectric spacers on either side of the common PMOS gate electrode stack, each of the second pair of dielectric spacers including a continuous material disposed along a sidewall of the common PMOS gate electrode and surrounding a discrete portion of each of the vertically stacked silicon germanium or germanium nanowires, and a pair of PMOS source and drain regions on either side of the second pair of dielectric spacers.

In one embodiment, an uppermost surface of the first pair of dielectric spacers is below an uppermost surface of the common NMOS gate electrode stack, and an uppermost surface of the second pair of dielectric spacers is below an uppermost surface of the common PMOS gate electrode stack.

In one embodiment, the pair of NMOS source and drain regions has an uppermost surface below the uppermost surface of the first pair of dielectric spacers, and the pair of NMOS source and drain regions has an uppermost surface below the uppermost surface of the second pair of dielectric spacers.

In one embodiment, the pair of NMOS source and drain regions is a pair of common source and drain regions coupled to the plurality of vertically stacked silicon nanowires, and the pair of PMOS source and drain regions is a pair of common source and drain regions coupled to the plurality of vertically stacked silicon germanium or germanium nanowires.

In one embodiment, the substrate is a single crystalline semiconductor substrate, and the pair of common NMOS source and drain regions is a pair of epitaxial semiconductor regions further coupled to an exposed portion of the single crystalline semiconductor substrate, and the pair of common PMOS source and drain regions is a pair of epitaxial semiconductor regions further coupled to an exposed portion of the single crystalline semiconductor substrate.

In one embodiment, the semiconductor structure further includes a first pair of conductive contacts disposed on the pair of common NMOS source and drain regions, and a second pair of conductive contacts disposed on the pair of common PMOS source and drain regions.

In one embodiment, the common NMOS gate electrode stack includes a first high-k gate dielectric layer disposed on and surrounding each of the discrete channel regions of the plurality of vertically stacked silicon nanowires, and the common PMOS gate electrode stack includes a second high-k gate dielectric layer disposed on and surrounding each of the discrete channel regions of the plurality of vertically stacked silicon germanium or germanium nanowires.

In one embodiment, the common NMOS gate electrode stack further includes a first metal gate disposed on the first high-k gate dielectric layer, and the common PMOS gate electrode stack further includes a second metal gate disposed on the second high-k gate dielectric layer.

In an embodiment, a method of fabricating a semiconductor device includes forming a fin structure above a substrate, the fin structure including alternating active layers and sacrificial layers. The method also includes forming a sacrificial gate stack on the fin structure, exposing source and drain regions of the fin structure. The method also includes removing portions of the sacrificial layers of the fin structure in the source and drain regions. The method also includes, subsequent to removing portions of the sacrificial layers of the fin structure in the source and drain regions, forming a conformal dielectric material layer in the source and drain regions and over the sacrificial gate stack. The method also includes etching the conformal dielectric material layer to form a pair of dielectric spacers on either side of the common gate electrode stack, each of the pair of dielectric spacers including a continuous material disposed along a sidewall of the sacrificial gate stack and surrounding a discrete portion of each of the active layers in the source and drain regions. The method also includes, subsequent to etching the conformal dielectric material layer to form the pair of dielectric spacers, forming source and drain structures in the source and drain regions. The method also includes, subsequent to forming the source and drain structures, removing the sacrificial gate stack to expose a channel region of the fin structure. The method also includes removing portions of the sacrificial layers of the fin structure in the channel region. The method also includes forming a permanent gate electrode stack between the pair of dielectric spacers and surrounding a discrete portion of each of the active layers in the channel region.

In one embodiment, forming the conformal dielectric material layer includes depositing the conformal dielectric material layer by atomic layer deposition (ALD).

In one embodiment, removing portions of the sacrificial layers of the fin structure in the source and drain regions and removing portions of the sacrificial layers of the fin structure in the channel region includes removing sacrificial silicon germanium using a wet etching process with a composition selected from the group consisting of an aqueous carboxylic acid/nitric acid/HF solution and an aqueous citric acid/nitric acid/HF solution.

In one embodiment, removing portions of the sacrificial layers of the fin structure in the source and drain regions and removing portions of the sacrificial layers of the fin structure in the channel region includes removing sacrificial silicon using an aqueous hydroxide chemistry selected from the group consisting of aqueous ammonium hydroxide and aqueous potassium hydroxide.

In one embodiment, forming source and drain structures in the source and drain regions includes epitaxially growing a semiconductor material in the source and drain regions.

What is claimed is:

1. A semiconductor device, comprising:
    a plurality of vertically stacked nanowires disposed above a substrate, each of the nanowires comprising a discrete channel region;
    a common gate electrode stack surrounding each of the discrete channel regions of the plurality of vertically stacked nanowires;
    a pair of dielectric spacers on either side of the common gate electrode stack, each of the pair of dielectric spacers comprising a continuous material disposed along a sidewall of the common gate electrode and surrounding a discrete portion of each of the vertically stacked nanowires, the continuous material between adjacent ones of the vertically stacked nanowires; and
    a pair of source and drain regions on either side of the pair of dielectric spacers.

2. The semiconductor device of claim 1, wherein an uppermost surface of the pair of dielectric spacers is below an uppermost surface of the common gate electrode stack.

3. The semiconductor device of claim 2, wherein the pair of source and drain regions has an uppermost surface below the uppermost surface of the pair of dielectric spacers.

4. The semiconductor device of claim 1, wherein the pair of source and drain regions is a pair of common source and drain regions coupled to the plurality of vertically stacked nanowires.

5. The semiconductor device of claim 4, wherein the substrate is a single crystalline semiconductor substrate, and the pair of common source and drain regions is a pair of epitaxial semiconductor regions further coupled to an exposed portion of the single crystalline semiconductor substrate.

6. The semiconductor device of claim 4, further comprising:
    a pair of conductive contacts disposed on the pair of common source and drain regions.

7. The semiconductor device of claim 1, wherein the common gate electrode stack comprises a high-k gate dielectric layer disposed on and surrounding each of the discrete channel regions of the plurality of vertically stacked nanowires.

8. The semiconductor device of claim 7, wherein the common gate electrode stack further comprises a metal gate disposed on the high-k gate dielectric layer.

9. The semiconductor device of claim 1, wherein the substrate is a monocrystalline silicon substrate, and the plurality of vertically stacked nanowires is a plurality of vertically stacked single crystalline silicon nanowires.

10. The semiconductor device of claim 1, wherein the substrate is a monocrystalline silicon substrate, and the plurality of vertically stacked nanowires is a plurality of vertically stacked single crystalline silicon germanium or single crystalline germanium nanowires.

11. A semiconductor structure, comprising:
an NMOS semiconductor device, comprising:
a plurality of vertically stacked silicon nanowires disposed above a substrate, each of the silicon nanowires comprising a discrete channel region;
a common NMOS gate electrode stack surrounding each of the discrete channel regions of the plurality of vertically stacked silicon nanowires;
a first pair of dielectric spacers on either side of the common NMOS gate electrode stack, each of the first pair of dielectric spacers comprising a continuous material disposed along a sidewall of the common NMOS gate electrode and surrounding a discrete portion of each of the vertically stacked silicon nanowires, the continuous material between adjacent ones of the vertically stacked silicon nanowires; and
a pair of NMOS source and drain regions on either side of the first pair of dielectric spacers; and
a PMOS semiconductor device, comprising:
a plurality of vertically stacked silicon germanium or germanium nanowires disposed above a substrate, each of the silicon germanium or germanium nanowires comprising a discrete channel region;
a common PMOS gate electrode stack surrounding each of the discrete channel regions of the plurality of vertically stacked silicon germanium or germanium nanowires;
a second pair of dielectric spacers on either side of the common PMOS gate electrode stack, each of the second pair of dielectric spacers comprising a continuous material disposed along a sidewall of the common PMOS gate electrode and surrounding a discrete portion of each of the vertically stacked silicon germanium or germanium nanowires, the continuous material between adjacent ones of the vertically stacked silicon germanium or germanium nanowires; and
a pair of PMOS source and drain regions on either side of the second pair of dielectric spacers.

12. The semiconductor structure of claim 11, wherein an uppermost surface of the first pair of dielectric spacers is below an uppermost surface of the common NMOS gate electrode stack, and an uppermost surface of the second pair of dielectric spacers is below an uppermost surface of the common PMOS gate electrode stack.

13. The semiconductor structure of claim 12, wherein the pair of NMOS source and drain regions has an uppermost surface below the uppermost surface of the first pair of dielectric spacers, and the pair of NMOS source and drain regions has an uppermost surface below the uppermost surface of the second pair of dielectric spacers.

14. The semiconductor structure of claim 11, wherein the pair of NMOS source and drain regions is a pair of common source and drain regions coupled to the plurality of vertically stacked silicon nanowires, and the pair of PMOS source and drain regions is a pair of common source and drain regions coupled to the plurality of vertically stacked silicon germanium or germanium nanowires.

15. The semiconductor structure of claim 14, wherein the substrate is a single crystalline semiconductor substrate, and the pair of common NMOS source and drain regions is a pair of epitaxial semiconductor regions further coupled to an exposed portion of the single crystalline semiconductor substrate, and the pair of common PMOS source and drain regions is a pair of epitaxial semiconductor regions further coupled to an exposed portion of the single crystalline semiconductor substrate.

16. The semiconductor structure of claim 14, further comprising:
a first pair of conductive contacts disposed on the pair of common NMOS source and drain regions; and
a second pair of conductive contacts disposed on the pair of common PMOS source and drain regions.

17. The semiconductor structure of claim 11, wherein the common NMOS gate electrode stack comprises a first high-k gate dielectric layer disposed on and surrounding each of the discrete channel regions of the plurality of vertically stacked silicon nanowires, and the common PMOS gate electrode stack comprises a second high-k gate dielectric layer disposed on and surrounding each of the discrete channel regions of the plurality of vertically stacked silicon germanium or germanium nanowires.

18. The semiconductor structure of claim 17, wherein the common NMOS gate electrode stack further comprises a first metal gate disposed on the first high-k gate dielectric layer, and the common PMOS gate electrode stack further comprises a second metal gate disposed on the second high-k gate dielectric layer.

* * * * *